(12) United States Patent
Yumoto et al.

(10) Patent No.: US 7,098,625 B2
(45) Date of Patent: Aug. 29, 2006

(54) APPARATUS AND METHOD FOR ESTIMATING CHARGE RATE OF SECONDARY CELL

(75) Inventors: Daijiro Yumoto, Kanagawa (JP); Hideo Nakamura, Yokohama (JP)

(73) Assignee: Nissan Motor Co., Ltd., Yokohama (JP)

( * ) Notice: Subject to any disclaimer, the term of this patent is extended or adjusted under 35 U.S.C. 154(b) by 343 days.

(21) Appl. No.: 10/695,800

(22) Filed: Oct. 30, 2003

(65) Prior Publication Data

US 2004/0100227 A1    May 27, 2004

(30) Foreign Application Priority Data

Nov. 25, 2002    (JP) ............................. 2002-340803

(51) Int. Cl.
*H02J 7/00*    (2006.01)
(52) U.S. Cl. .................................... 320/132
(58) Field of Classification Search ............... 320/132; 324/126–130
See application file for complete search history.

(56) References Cited

U.S. PATENT DOCUMENTS

| | | | |
|---|---|---|---|
| 6,850,038 B1 * | 2/2005 | Arai et al. ............... | 320/132 |
| 6,909,261 B1 * | 6/2005 | Laig-Horstebrock et al. ............... | 320/132 |
| 6,909,287 B1 * | 6/2005 | Bertness ............... | 324/427 |
| 6,927,554 B1 * | 8/2005 | Tate et al. ............... | 320/132 |

FOREIGN PATENT DOCUMENTS

| | | |
|---|---|---|
| JP | 2000-268886 A | 9/2000 |
| JP | 2000-323183 A | 11/2000 |
| JP | 2003-75518 A | 3/2003 |
| WO | WO 00/55639 A1 | 9/2000 |

OTHER PUBLICATIONS

T. Torikai et al., "Research and Development of the Model-Based Battery State of Charge Indicator", Signal Processing and System Control, Intelligent Sensors and Instrumentation, Nov. 9-13, 1992, pp. 996-1001.

J. Kozlowski et al., "Model-Based Predictive Diagnosis for Electrochemical Energy Source", Aerospace Conference, 2001, IEEE Proceedings, Mar. 10-17, 2001, p. 3149-3164.

Shigenori Matsumura et al., "Estimation of Open Voltage and Residual Values for Pb Battery by Adaptive Digital Filter", 1992, pp. 259-267, vol. 112-C-No. 4, T.IEEE Japan.

* cited by examiner

*Primary Examiner*—Pia Tibbits
(74) *Attorney, Agent, or Firm*—Foley & Lardner LLP

(57) ABSTRACT

In charge rate estimating apparatus and method for a secondary cell, a current flowing through the secondary cell is measured, a voltage across terminals of the secondary cell is measured, an adaptive digital filtering is carried out using a cell model in a continuous time series shown in an equation (1), all of parameters at one time are estimated, the parameters corresponding to an open-circuit voltage which is an offset term of the equation (1) and coefficients of A(s), B(s), and C(s) which are transient terms, and, the charge rate is estimated from a relationship between a previously derived open-circuit voltage $V_0$ and the charge rate SOC using the open-circuit voltage $V_0$, $$V = \frac{B(s)}{A(s)} \cdot I + \frac{1}{C(s)} \cdot V_0, \quad (1)$$

wherein s denotes a Laplace transform operator, A(s), B(s), and C(s) denote poly-nominal functions of s.

15 Claims, 4 Drawing Sheets

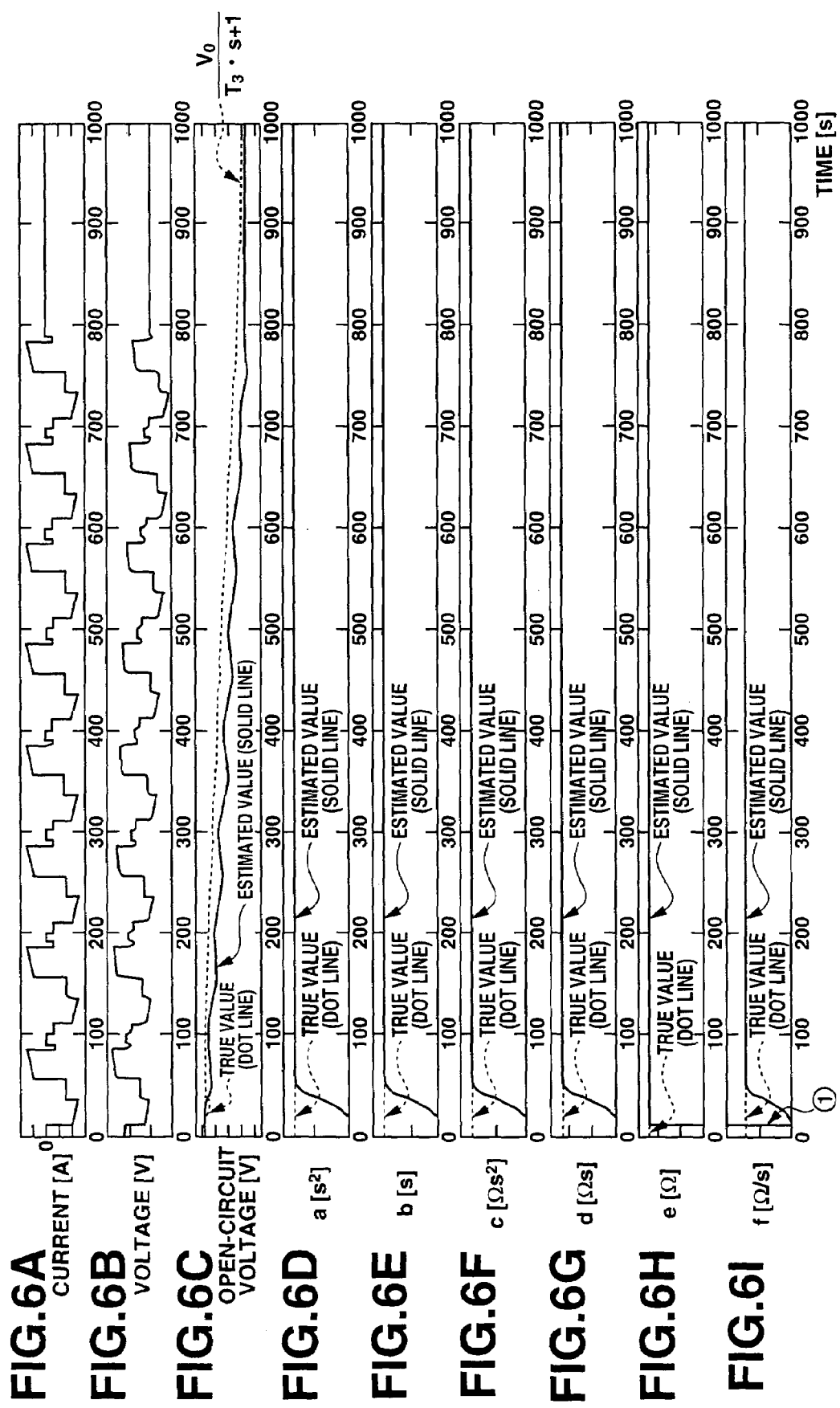

APPARATUS AND METHOD FOR ESTIMATING CHARGE RATE OF SECONDARY CELL

BACKGROUND OF THE INVENTION

1. Field of the Invention

The present invention relates to apparatus and method for estimating a charge rate (abbreviated as SOC) of a secondary cell.

2. Description of the Related Art

Japanese Patent Application First Publications No. 2000-323183 published on Nov. 24, 2000 No. 2000-268886 published on Sep. 29, 2000, and a Japanese Paper titled "Estimation of Open Voltage and Residual Values for Pb Battery by Adaptive Digital Filter" announced by a Japanese Electrical Engineering Society (T.IEEE Japan), Volume 112-C, No. 4, published on 1992 exemplify previously proposed SOC estimating apparatus for the secondary cell. That is to say, since the charge rate (or called State Of Charge, i.e., SOC) of the secondary cell has a correlation to an open-circuit voltage $V_0$ (cell terminal voltage when its power supply of the cell is turned off, also called electromotive force or open voltage), the charge rate can be estimated when open voltage $V_0$ is obtained. However, a considerable time is needed until the terminal voltage is stabilized after the power supply is turned off (charge-and-discharge is ended). Hence, a predetermined time duration is needed from a time at which the charge-and-discharge is ended to determine an accurate open-circuit voltage $V_0$. Therefore, since immediately after or during the charge/discharge time or charge-and-discharge, it is impossible to determine an accurate open-circuit voltage and the charge rate cannot be obtained using the above-described method. Nevertheless, to determine the open-circuit voltage $V_0$, the open-circuit voltage $V_0$ is estimated using a method disclosed in the above-described Japanese Patent Application First Publication No. 2000-323183.

SUMMARY OF THE INVENTION

However, in the above-described method disclosed in the Japanese Patent Application Publication No. 2000-323183, open-circuit voltage $V_0$ is calculated from a non-recursive (non-regression type) cell model (a model whose output value is determined only from a present value and past value of an input value) whose characteristic is wholly different from a physical characteristic of the cell for which an adaptive digital filter (sequential type model parameter identification algorithm) is used. The charge rate (SOC) is used from this value. Hence, in a case where this method is applied to the actual cell characteristic (input: current, output: voltage), according to the cell characteristic, an estimation calculation is wholly converged or does not converge to a real value. Hence, it is difficult to estimate the charge rate (SOC) accurately.

It is, hence, an object of the present invention to provide apparatus and method for estimating accurately the charge rate (SOC) for the secondary cell and accurately estimating other parameters related to the charge rate (SOC).

According to one aspect of the present invention, there is provided a charge rate estimating apparatus for a secondary cell, comprising: a current detecting section capable of measuring a current flowing through the secondary cell; a terminal voltage detecting section capable of measuring a voltage across terminals of the secondary cell; a parameter estimating section that calculates an adaptive digital filtering using a cell model in a continuous time series shown in an equation (1) and estimates all parameters at one time, the parameters corresponding to an open-circuit voltage $V_0$, which is an offset term of the equation, (1) and coefficients of A(s), B(s), and C(s), which are transient terms; and a charge rate estimating section that estimates the charge rate from a previously derived relationship between an open-circuit voltage and a charge rate of the secondary cell and the open-circuit voltage $V_0$, $$V = \frac{B(s)}{A(s)} \cdot I + \frac{1}{C(s)} \cdot V_0, \quad (1)$$

wherein s denotes a Laplace transform operator, A(s), B(s), and C(s) denote poly-nominal functions of s.

According to another aspect of the present invention, there is provided a charge rate estimating method for a secondary cell, comprising: measuring a current flowing through the secondary cell; measuring a voltage across terminals of the secondary cell; calculating an adaptive digital filtering using a cell model in a continuous time series shown in an equation (1); estimating all parameters at one time, the parameters corresponding to an open-circuit voltage $V_0$, which is an offset term of the equation (1), and coefficients of A(s), B(s), and C(s), which are transient terms; and estimating the charge rate from a previously derived relationship between an open-circuit voltage and a charge rate of secondary cell, and the open-circuit voltage $V_0$, $$V = \frac{B(s)}{A(s)} \cdot I + \frac{1}{C(s)} \cdot V_0, \quad (1)$$

wherein s denotes a Laplace transform operator, A(s), B(s), and C(s) denote poly-nominal functions of s.

According to a still another object of the present invention, there is provided a charge rate estimating method for a secondary cell, comprising: measuring a current I(k) flowing through the secondary cell; measuring a terminal voltage V(k) across the secondary cell; storing the terminal voltage V(k) when a current is zeroed as an initial value of the terminal voltage $\Delta V(k)=V(k)-V\_ini$; determining instantaneous current values $I_0(k)$, $I_1(k)$, and $I_3(k)$ and instantaneous terminal voltages $V_1(k)$, $V_2(k)$, and $V_3(k)$ from an equation (19), $$I_0 = \frac{1}{G_1(s)} \cdot I,$$

$$I_1 = \frac{s}{G_1(s)} \cdot I, \quad V_1 = \frac{s}{G_1(s)} \cdot V,$$

$$I_2 = \frac{s^2}{G_1(s)} \cdot I, \quad V_2 = \frac{s^2}{G_1(s)} \cdot V,$$

$$I_3 = \frac{s^3}{G_1(s)} \cdot I, \quad V_3 = \frac{s^3}{G_1(s)} \cdot V,$$

$$\frac{1}{G_1(s)} = \frac{1}{(p1 \cdot s + 1)^3}, \quad (19)$$

wherein p1 denotes a constant determining a responsive characteristic of $G_1(s)$; substituting the instantaneous current values $I_0(k)$, $I_1(k)$, $I_2(k)$, and $I_3(k)$ and the instantaneous terminal voltages $V_1(k)$, $V_2(k)$, and $V_3(k)$ into an equation (18), $$\gamma(k) = \frac{\lambda_3(k)}{1 + \lambda_3(k) \cdot \omega^T(k) \cdot P(k-1) \cdot \omega(k)} \quad (18)$$

$$\theta(k) = \theta(k-1) - \gamma(k) \cdot P(k-1) \cdot \omega(k) \cdot [\omega^T(k) \cdot \theta(k-1) - y(k)]$$

$$P(k) = \frac{1}{\lambda_1(k)} \left\{ P(k-1) - \frac{\lambda_3(k) \cdot P(k-1) \cdot \omega(k) \cdot \omega^T(k) \cdot P(k-1)}{1 + \lambda_3(k) \cdot \omega^T(k) \cdot P(k-1) \cdot \omega(k)} \right\}$$

$$= \frac{P'(k)}{\lambda_1(k)}$$

$$\lambda_1(k) = \left\{ \frac{\text{trace}\{P'(k)\}}{\gamma_U} : \lambda_1 \le \frac{\text{trace}\{P'(k)\}}{\gamma_U} \right.$$

$$\left\{ \lambda_1 : \frac{\text{trace}\{P'(k)\}}{\gamma_U} \le \lambda_1 \le \frac{\text{trace}\{P'(k)\}}{\gamma_L} \right.$$

$$\left\{ \frac{\text{trace}\{P'(k)\}}{\gamma_L} : \frac{\text{trace}\{P'(k)\}}{\gamma_L} \le \lambda_1, \right.$$

wherein $\theta(k)$ denotes a parameter estimated value at a time point of k (k=0, 1, 2, 3 - - - ), $\lambda_1$, $\lambda_3(k)$, $\gamma u$, and $\gamma L$ denote initial set value, $b < \lambda_1 < 1$, $0 < \lambda_3(k) < \infty$. P(0) is a sufficiently large value, $\theta(0)$ provides an initial value which is non-zero but very sufficiently small value, trace{P} means a trace of matrix P, wherein $y(k) = V_1(k)$ $$\omega^T(k) = [\ V_3(k)\ \ V_2(k)\ \ I_3(k)\ \ I_2(k)\ \ I_1(k)\ \ I_0(k)\ ] \quad (20)$$

$$\theta(k) = \begin{bmatrix} -a(k) \\ -b(k) \\ c(k) \\ d(k) \\ e(k) \\ f(k) \end{bmatrix};$$

substituting a, b, c, d, e, and f in the parameter estimated value $\theta(k)$ into and equation (22) to calculate $V_0$ which is an alternate of $V_0$ which corresponds to a variation $\Delta V_0(k)$ of the open-circuit voltage estimated value from a time at which the estimated calculation start is carried out;

$$V_0' = \frac{(T_1 \cdot s + 1)}{G_2(s)} \cdot V_0 = a \cdot v_6 + b \cdot v_5 + v_4 - c \cdot I_6 - d \cdot I_5 - e \cdot I_4; \quad (22)$$

and calculating an open-circuit voltage estimated value $V_0(k)$ according the variation $\Delta V_0(k)$ of the open-circuit voltage estimated value and the terminal voltage initial value V_ini.

This summary of the invention does not necessarily describe all necessary features so that the invention may also be a sub-combination of these described features.

BRIEF DESCRIPTION OF THE DRAWINGS

FIGS. 6A, 6B, 6C, 6D, 6E, 6F, 6G, 6H and 6I are characteristic graphs representing results of simulations of current, voltages, and various parameters in a case of the charge rate estimating apparatus in the embodiment shown in FIG. 1

DETAILED DESCRIPTION OF THE PREFERRED EMBODIMENTS

Reference will hereinafter be made to the drawings in order to facilitate a better understanding of the present invention.

Figure 1:
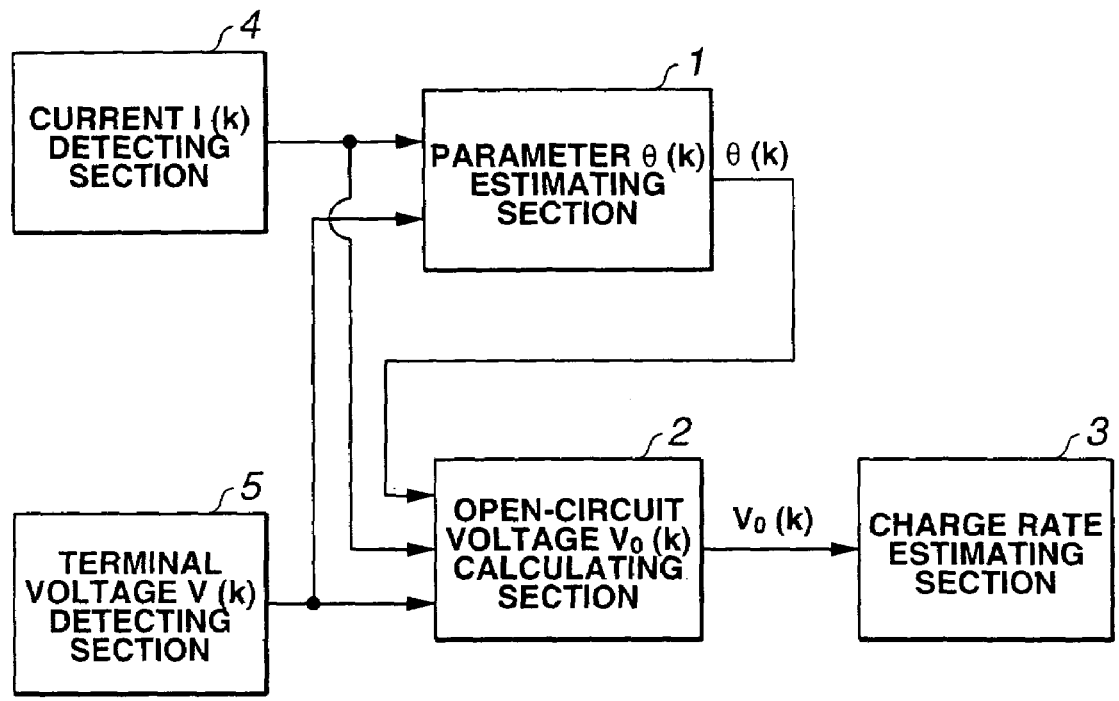
FIG. 1 is a functional block diagram of an apparatus for estimating a charge rate (SOC) of a secondary cell in a preferred embodiment according to the present invention.

FIG. 1 shows a functional block diagram of charge rate estimating apparatus in a first preferred embodiment according to the present invention. In FIG. 1, a reference numeral 1 denotes a parameter estimating section based on a cell model with an open-circuit voltage $V_0(k)$ as an offset term. In addition, a reference numeral 2 denotes a open-circuit voltage calculating section to calculate open-circuit voltage $V_0(k)$, and a reference numeral 3 denotes a charge rate estimating section that calculate the charge rate from the open-circuit voltage. In addition, a reference numeral 4 denotes a current I measuring block to detect current I(k) which is charged and discharged into and from the cell, and a reference numeral 5 denotes s terminal voltage of the cell to measure the terminal voltage V(k).

Figure 2:
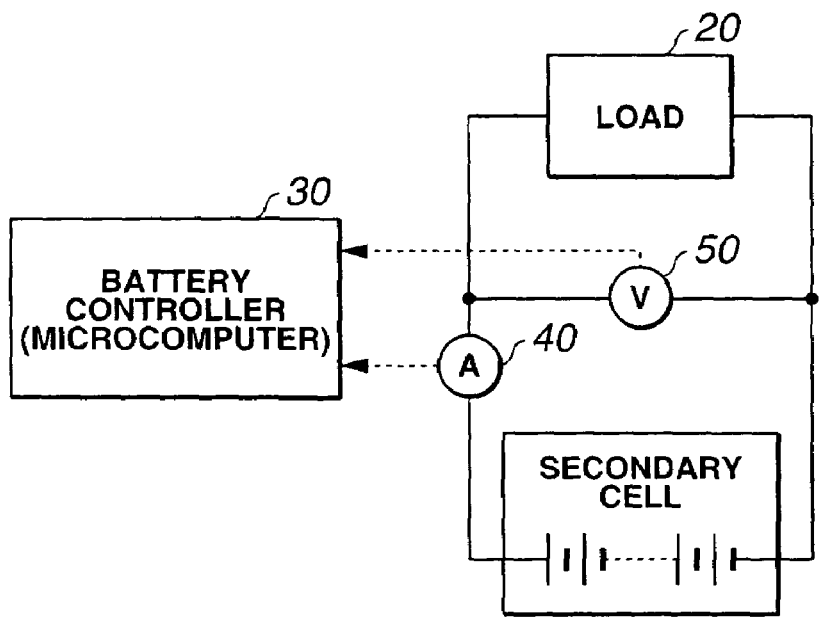
FIG. 2 is a specific circuit block diagram of the apparatus for estimating the charge rate (SOC) of the secondary cell in the preferred embodiment according to the present invention.

FIG. 2 shows a block diagram representing a specific structure of the charge rate estimating apparatus in the first embodiment. In this embodiment, a load such as a motor is driven with the secondary cell and the charge rate estimating apparatus is mounted in a system to charge the secondary cell with a regenerative power of the motor (load). In FIG. 2, a reference numeral 10 denotes a secondary cell (simply called, a cell), a reference numeral 20 denotes a load such as a DC motor, a reference numeral 30 denotes a battery controller (electronic control unit) to estimate the charge rate (charge state) of the cell having a microcomputer including a ROM (Read Only Memory), a RAM (Random Access Memory), a CPU (central Processing Unit), and Input/Output Interface and other electronic circuits. A reference numeral 40 denotes a current meter to detect a current which is charged into or discharged from the cell, a reference numeral 50 denotes a voltage meter to detect the terminal voltage of the cell, a reference numeral 60 denotes a temperature meter to detect a temperature of the cell. These meters are connected to battery controller 30. Battery controller 30 corresponds to parts of parameter estimating section 1, an open-circuit voltage $V_0(k)$ and a charge rate estimating section 3. Current meter 40 corresponds to current I(k) measuring section and voltage meter 50 correspond to terminal voltage V(k) measuring section 5.

Figure 3:
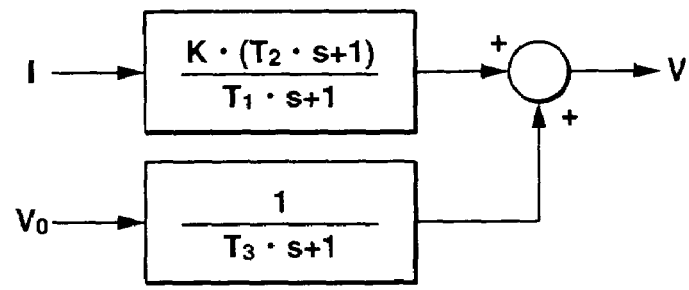
FIG. 3 is a model view representing an equivalent circuit model of the secondary cell.

First, a "cell model" used in the first embodiment will be described below. FIG. 3 is an equivalent circuit representing an equivalent circuit model of the secondary cell. The equivalent circuit model of the secondary cell can be represented by the following equation (7) (=equation (6)).

$$V = \frac{K \cdot (T_2 \cdot s + 1)}{T_1 \cdot s + 1} \cdot I + \frac{1}{T_3 \cdot s + 1} V_0. \quad (7)$$

In equation (7), a model input is a current I[A] (a positive value represents a charge and a negative value represents a discharge), a model output is a terminal voltage V[V], an open-circuit voltage is $V_0$, K denotes an internal resistance, $T_1$ through $T_3$ denote time constants ($T_1 \neq T_2 \neq T_3$, $T_1 \ll T_3$) and s denotes a Laplace transform operator.

In this model based on equation of (7) is a reduction model (first order) in which a positive pole and a negative pole are not specially separated from each other. However, it is possible to represent a charge-discharge characteristic of an actual cell relatively easily. Equation (7), in equation (1) of $V=B(s)/A(s) \cdot I+1/C(s) \cdot V_0$ - - - (1), $A(s)=T_1 \cdot s+1$, $B(s)=K \cdot (T_2 \cdot s+1)$, $C(s)=T_3 \cdot s+1$.

Hereinafter, a deviation from the cell model based on equation (7) to an adaptive digital filter will first be described below. Open-circuit voltage $V_0$ can be described by an equation (8), supposing that a value of a current I multiplied with a variable efficiency of A is integrated from a certain initial state.

That is to say, $$V_0 = \frac{A}{s} \cdot I. \quad (8)$$

It is noted that equation (8) corresponds to a replacement of h recited in equation (2), viz., $V_0 = h/s \cdot I$ with efficiency of A.

If equation (8) is substituted into equation (7), equation (9) is resulted.

$$V_0 = \frac{K \cdot (T_2 \cdot s + 1)}{T_1 \cdot s + 1} \cdot I + \frac{1}{T_3 \cdot s + 1} \cdot \frac{A}{s} \cdot I. \quad (9)$$

Equation (9) corresponds to equation (3)

$$\left( V = \left( \frac{B(s)}{A(s)} + \frac{1}{C(s)} \cdot \frac{h}{s} \right) \cdot I = \frac{s \cdot B(s) \cdot C(s) + h \cdot A(s)}{s \cdot A(s) \cdot C(s)} \cdot I \quad (3) \right).$$

$A(s)$, $B(s)$, and $C(s)$ in equation (3), the following equations are substituted into equation (9) in the same way as the case of equation (7).

$A(s)=T_1 \cdot s+1$,
$B(s)=K \cdot (T_2 \cdot s+1)$
$C(s)=T_3 \cdot s+1$. In other words, equation (3) is a generalized equation and this application to a first order model is equation (9). If equation (9) is arranged, an equation of (10) is given.

$$S \cdot (T_1 s + 1)(T_3 \cdot s + 1) \cdot V = \quad (10)$$
$$K \cdot (T_2 \cdot s + 1)(T_3 \cdot s + 1) s \cdot I + A \cdot (T_1 \cdot s + 1) \cdot I$$
$$\{T_1 \cdot T_3 \cdot s^3 + (T_1 + T_3) \cdot s^2 + s\} \cdot V =$$
$$\{K \cdot T_2 \cdot T_3 \cdot s^3 + K \cdot (T_2 + T_3) \cdot s^2 + (K + A \cdot T_1) \cdot s + A\} \cdot I$$
$$(a \cdot s^3 + b \cdot s^2 + s) \cdot V = (c \cdot s^3 + d \cdot s^2 + e \cdot s + f) \cdot I.$$

It is noted that, in the last equation of equation (10), parameters are rewritten as follows:

$$a=T_1 \cdot T_3, \; b=T_1+T_3, \; c=K \cdot T_2 \cdot T_3, \; d=K \cdot (T_2+T_3), \; e=K+ A \cdot T_1, \text{ and } f=A \quad (11)$$

If a stable low pass filter $G_1(s)$ is introduced into both sides of equation (10) and arranged, the following equation (12) is given.

$$\frac{1}{G_1(s)}(a \cdot s^3 + b \cdot s^2 + s) \cdot V = \frac{1}{G_1(s)}(c \cdot s^3 + d \cdot s^2 + e \cdot s + f) \cdot I. \quad (12)$$

In details, in equation (10), on the contrary of equation (7), if $T_1 \cdot s+1=A(s)$, $K \cdot (T_2 \cdot s+1)=B(s)$, and $T_3 \cdot s+1=C(s)$ are substituted into equation (10), this is given as: $s \cdot A(s) \cdot C(s) \cdot V = B(s) \cdot C(s) \cdot s \cdot I + A \cdot A(s) \cdot I$. This is rearranged as follows: $s \cdot A(s) \cdot C(s) \cdot V = [B(s) \cdot C(s) \cdot s\; [[\cdot I]] + A \cdot A(s)] \cdot I$ - - - (12)'. If, the low pass filter (LPF), $G_1(s)$ is introduced into both sides of equation (12)', an equation (4) is given.

That is to say, $$\frac{s \cdot A(s) \cdot C(s)}{G_1(s)} \cdot V = \frac{s \cdot B(s) \cdot C(s) + h \cdot A(s)}{s \cdot A(s) \cdot C(s)} \cdot I. \quad (4)$$

It is noted that s denotes the Laplace transform operator, $A(s)$, $B(s)$, and $C(s)$ denote a poly-nominal function of s, h denotes a variable, and $1/G_1(s)$ denotes a transfer function having a low pass filter characteristic. That is to say, equation (4) is the generalized function, equation (12) is the application of equation (4) to the first order model.

Current I and terminal voltage V which can actually be measured are processed by means of a low pass filter (LPF) and a band pass filter (BPF) are defined in the following equations (13), provided that $p_1$ denotes a constant to determine a responsive characteristic of G1(s) and is determined according to a designer's desire.

$$I_0 = \frac{1}{G_1(s)} \cdot I \quad (13)$$
$$I_1 = \frac{s}{G_1(s)} \cdot I, \quad V_1 = \frac{s}{G_1(s)} \cdot V,$$
$$I_2 = \frac{s^2}{G_1(s)} \cdot I, \quad V_2 = \frac{s^2}{G_1(s)} \cdot V,$$
$$I_3 = \frac{s^3}{G_1(s)} \cdot I, \quad V_3 = \frac{s^3}{G_1(s)} \cdot V,$$
$$\frac{1}{G_1(s)} = \frac{1}{(P_1 \cdot s + 1)^3}$$

If equation (12) is rewritten using the variables shown in equations (13), equations (14) are represented and, if deformed, the following equation (15) is given.

$$a \cdot V_3 + b \cdot V_2 + v_1 = c \cdot I_3 + d \cdot I_2 + e \cdot I_1 + f \cdot I_0$$

$$V_1 = -a \cdot V_3 - b \cdot V_2 + c \cdot I_3 + d \cdot I_2 + e \cdot I_1 + f \cdot I_0 \quad (14)$$

$$V_1 = [V_3 \quad V_2 \quad I_3 \quad I_2 \quad I_1 \quad I_0] = \begin{bmatrix} -a \\ -b \\ c \\ d \\ e \\ f \end{bmatrix}. \quad (15)$$

Equation (15) is a product-sum equation of measurable values and unknown parameters. Hence, a standard (general) type (equation (16)) of the adaptive digital filter is coincident with equation (15). It is noted that $\omega^T$ means a transposed vector in which a row and column of a vector $\omega$ are mutually exchanged.

$y = \omega^T \cdot \theta$ - - - (16). It is noted that y, $\omega^T$, and $\theta$ can be expressed in the following equation (17) in equation (16) described above.

$$Y = V_1, \omega^T = [V_3 \quad V_2 \quad I_3 \quad I_2 \quad I_1 \quad I_0], \theta = \begin{bmatrix} -a \\ -b \\ c \\ d \\ e \\ f \end{bmatrix}. \quad (17)$$

Hence, if a signal filter processed for current I and terminal voltage V is used in a digital filter process calculation, unknown parameter vector $\theta$ can be estimated.

In this embodiment, " a both-limitation trace gain method is used which improves a logical demerit of a simple " an adaptive digital filter by means of a least square method " such that once the estimated value is converged, an accurate estimation cannot be made any more even if the parameters are changed. A parameter estimating algorithm to estimate unknown parameter vector $\theta$ with equation (16) as a prerequisite is as shown in an equation (18). It is noted that the parameter estimated value at a time point of k is $\theta(k)$.

$$\gamma(k) = \frac{\lambda_3(k)}{1 + \lambda_3(k) \cdot \omega^T(k) \cdot P(k-1) \cdot \omega(k)} \quad (18)$$

$$\theta(k) = \theta(k-1) - \gamma(k) \cdot P(k-1) \cdot \omega(k) \cdot [\omega^T(k) \cdot \theta(k-1) - y(k)]$$

$$P(k) = \frac{1}{\lambda_1(k)} \left\{ P(k-1) - \frac{\lambda_3(k) \cdot P(k-1) \cdot \omega(k) \cdot \omega^T(k) \cdot P(k-1)}{1 + \lambda_3(k) \cdot \omega^T(k) \cdot P(k-1) \cdot \omega(k)} \right\}$$

$$= \frac{P'(k)}{\lambda_1(k)}$$

$$\lambda_1(k) = \left\{ \frac{\text{trace}\{P'(k)\}}{\gamma_U} : \lambda_1 \leq \frac{\text{trace}\{P'(k)\}}{\gamma_U} \right.$$

$$\left\{ \lambda_1 : \frac{\text{trace}\{P'(k)\}}{\gamma_U} \leq \lambda_1 \leq \frac{\text{trace}\{P'(k)\}}{\gamma_L} \right.$$

$$\left\{ \frac{\text{trace}\{P'(k)\}}{\gamma_L} : \frac{\text{trace}\{P'(k)\}}{\gamma_L} \leq \lambda_1 \right..$$

In equations (18), $\lambda_1$, $\lambda_3(k)$, $\gamma_u$, and $\gamma_L$ denote initial set value, $b < \lambda_1 < 1$, $0 < \lambda_3(k) < \infty$. P(0) is a sufficiently large value, $\theta(0)$ provides an initial value which is non-zero but very sufficiently small value. In addition, trace{P} means a trace of matrix P. As described above, the derivation of the adaptive digital filter from cell model.

Figure 5:
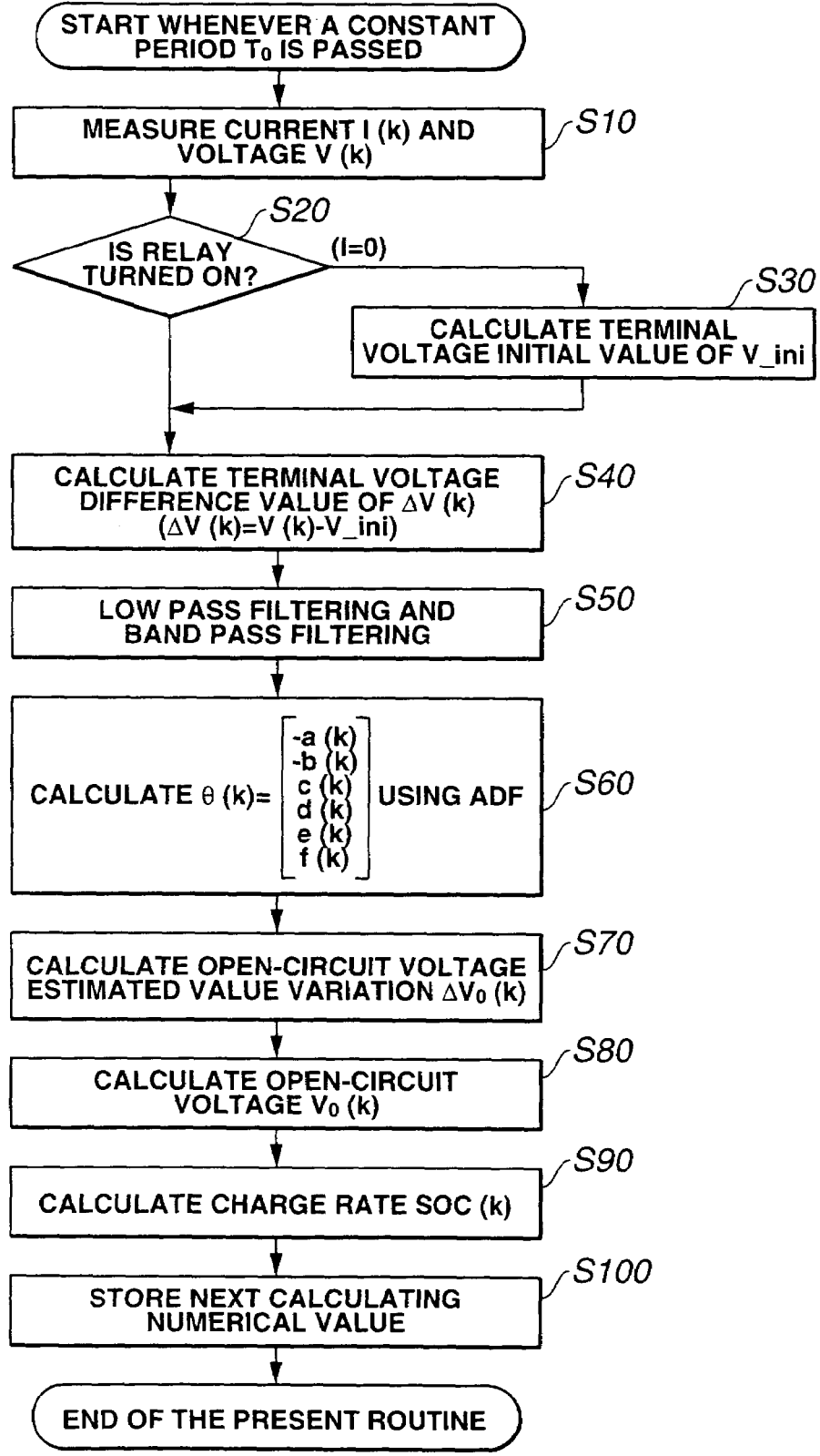
FIG. 5 is an operational flowchart for explaining an operation of a microcomputer of a battery controller of the charge rate estimating apparatus in the first preferred embodiment shown in FIG. 1.

FIG. 5 shows an operational flowchart carrying out the microcomputer of battery controller 30. A routine shown in 5 is carried out for each constant period of time $T_0$. For example, I(k) is the present value and I(k-1) means a one previous value of I(k). At a step S10, battery controller 30 measures current I(k) and I(k-1) means one previous value of I(k). At a step S20, battery controller 30 carries out a turn on-and-off determination of an interrupt relay of the secondary cell. That is to say, battery controller 30 performs the on-and-off control of the interrupt relay of the secondary cell. When a relay is turned off (current I=0), the routine goes to a step S30. During the engagement of the relay, the routine goes to a step S40. At step S30, when the relay is engaged, the routine goes to a step S540. At step S530, battery controller 30 serves to store terminal voltage V(k) to as an initial value of the terminal voltage V_ini. At a step S40, battery controller 30 calculates a differential value $\Delta V(k)$ of the terminal voltage. $\Delta V(k) = V(k) - V\_ini$. This is because the initial value of the estimation parameter in the adaptive digital filter is 0 so that the estimation parameter does not converge during the estimation calculation start time. Thus, all of inputs are zeroed. During the input being all zeroed. During the relay interruption, step S30 have been passed and the estimation parameters are remains initial state since I=0 and the estimation parameter remains alive.

At step S50, a low pass filtering or band pass filtering are carried out the current I(k) and terminal voltage difference value $\Delta V(k)$ on the basis of equation (13). $I_0(k)$ through $I_3(k)$ and $V_1(k)$ through $V_3(k)$ are calculated from equation (19). In this case, in order to improve an estimation accuracy of the parameter estimation algorithm of equation (18), a responsive characteristic of low pass filter $G_1(s)$ is set to be slow so as to reduce observation noises. However, if the characteristic is quicker than a response characteristic of the secondary cell (a rough value of time constant $T_1$ is known), each parameter of the electric cell model cannot accurately be estimated. It is noted that $p_1$ recited in equation (19) denotes a constant determined according to the responsive characteristic of $G_1(s)$.

$$I_0 = \frac{1}{G_1(s)} \cdot I, \quad (19)$$

$$I_1 = \frac{s}{G_1(s)} \cdot I, \qquad V_1 = \frac{s}{G_1(s)} \cdot V,$$

$$I_2 = \frac{s^2}{G_1(s)} \cdot I, \qquad V_2 = \frac{s^2}{G_1(s)} \cdot V,$$

$$I_3 = \frac{s^3}{G_1(s)} \cdot I, \qquad V_3 = \frac{s^3}{G_1(s)} \cdot V, \text{ and}$$

$$\frac{1}{G_1(s)} = \frac{1}{(p1 \cdot s + 1)^3}.$$

At a step S60, $I_0(k)$ through $I_3(k)$ calculated at step S50 and $V_1(k)$ through $V_3(k)$ are substituted into equation (18). Then, the parameter estimation algorithm in the adaptive digital filter, viz., equation (18) is executed to calculate parameter estimated value $\theta(k)$. y(k), $\omega^T(k)$, and $\theta(k)$ are shown in equation (20).

$$y(k) = V_1(k) \quad (20)$$

$$\omega^T(k) = [V_3(k) \quad V_2(k) \quad I_3(k) \quad I_2(k) \quad I_1(k) \quad I_0(k)]$$

-continued $$\theta(k) = \begin{bmatrix} -a(k) \\ -b(k) \\ c(k) \\ d(k) \\ e(k) \\ f(k) \end{bmatrix}.$$

At a step S70, a through e of parameter estimated value $\theta(k)$ calculated at step S60 are substituted into the following equation (22) in which the above-described cell model equation (7) is deformed to calculate $V_0'$ which is an alternative to open-circuit voltage $V_0$. Since the variation in open-circuit voltage $V_0$ is smooth, $V_0'$ can be used alternatively. It is noted that the derivation herein is a variation $\Delta V_0(k)$ of the open-circuit voltage from the estimated calculation start time.

It is noted that an equation of $[1/C1(s)]I$ in equation (21) is replaced with an equation (24) corresponds to equation (22). It is also noted that, in the derivation of equation (22), K in equation (21) is strictly different from e in equation (21). However, since, physically, $K \gg A \cdot T_1$, e is approximated to $K (e \approx K)$. Then, each coefficient a through e in equation (22) is the contents shown in equation (23).

tion (21). $T_1 \cdot s+1=A(s)$, $K \cdot (T_2 \cdot s+1) B(s)$, and $T_3 \cdot s+1=C(s)$. That is to say, $A(s) \cdot V_0 = A(s) \cdot C(s) \cdot V - B(s) \cdot C(s) \cdot I$. If this is rearranged, this results in $V_0 = C(s) \cdot V - B(s) \cdot C(s) \cdot I/A(s)$, $V_0 = C(s) \cdot [V - B(s) \cdot I/A(s)]$ If low pass filter $G_2(s)$ is introduced into both sides of this equation, this results in equation (5). In details, equation (5) is a generalization equation and the application of equation (5) to the first order model is equation (2).

At a step S80, battery controller 30 adds the open-circuit voltage initial value, i.e., terminal voltage initial value V_ini to a variation $\Delta V_0(k)$ of open-circuit voltage $V_0$ so as to obtain open-circuit voltage estimated value $V_0(k)$ from the following equation (25).

$$V_0(k) = \Delta V_0(k) + V\_ini \quad (25).$$

Figure 4:
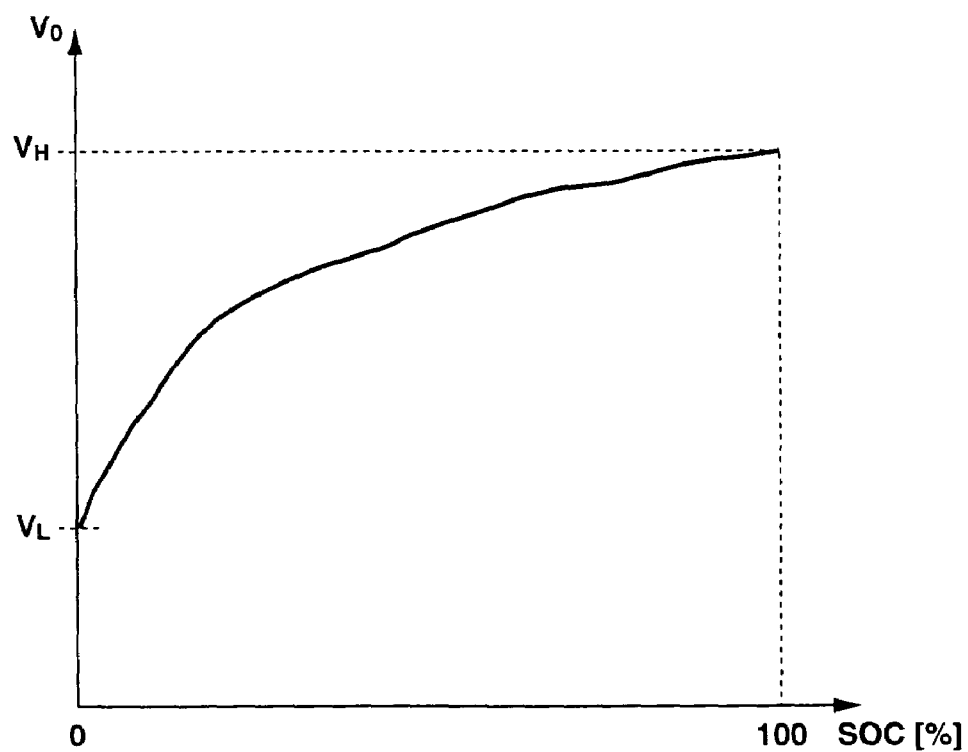
FIG. 4 is a correlation map representing a correlation between an open-circuit voltage and a charge rate (SOC).

At a step S90, battery controller 30 calculates the charge rate SOC(k) from open-circuit voltage $V_0(k)$ calculated at step S80 using a correlation map of the open-circuit voltage versus the charge rate as shown in FIG. 4. It is noted that, in FIG. 4, $V_L$ denotes the open-circuit voltage corresponding to SOC=0% and $V_H$ denotes the open-circuit voltage corresponding to SOC=100%. At a step S100, battery controller 30 stores the necessary numerical values needed in the subsequent calculation and the present routine is ended. As described above, an operation of the apparatus for estimating the charge rate of the secondary cell has been described.

(1) As described above, a relationship from among current I of the secondary cell and terminal voltage V thereof, and $$\frac{1}{T_3 \cdot s + 1} \cdot V_0 = V - \frac{K \cdot (T_2 + s + 1)}{T_1 \cdot s + 1} \cdot I \quad (21)$$

$$(T_1 \cdot s + 1) \cdot V_0 = (T_1 \cdot s + 1)(T_3 \cdot s + 1)V - K \cdot (T_2 \cdot s + 1)(T_3 \cdot s + 1) \cdot I$$

$$(T_1 \cdot s + 1) \cdot V_0 = \{T_1 \cdot T_3 \cdot s^2 + (T_1 + T_3) \cdot s + 1\} \cdot V - \{K \cdot T_2 \cdot T_3 \cdot s^2 + K \cdot (T_2 + T_3) \cdot s + K\} \cdot I$$

$$\frac{(T_1 \cdot s + 1)}{G_2} \cdot V_0 = \frac{1}{G_2(s)}(a \cdot s^2 + b \cdot s + K) \cdot I.$$

$$V_0' = \frac{(T_1 \cdot s + 1)}{G_2(s)} \cdot V_0 = a \cdot V_6 + b \cdot V_5 + V_4 - c \cdot I_6 - d \cdot I_5 - e \cdot I_4. \quad (22)$$

It is noted that $a = T_1 \cdot T_3$, $b = T_1 + T_3$, $c = K \cdot (T_2 + T_3)$, $d = K \cdot (T_2 + T_3)$, $e = K + A \cdot T_1 = K$ - - - (23).

$$I_4 = \frac{1}{G_2(s)} \cdot I, \quad V_4 = \frac{1}{G_2(s)} \cdot V, \quad (24)$$

$$I_5 = \frac{s}{G_2(s)} \cdot I, \quad V_5 = \frac{s}{G_2(s)} \cdot V,$$

$$\frac{1}{G_2(s)} = \frac{1}{p_2 \cdot s + 1} \cdot \frac{1}{T_1' \cdot s + 1},$$

$$I_6 = \frac{s^2}{G_2(s)} \cdot I, \text{ and } V_6 = \frac{s^2}{G_2(s)} \cdot V.$$

$p_2$ recited in equations (24) denote a constant to determine a responsive characteristic of $G_2(s)$. $T_1$ of the cell parameter is known to be several seconds. Hence, $T'_1$ in equation (24) is set to be approximated value to $T_1$. Thereby, since $(T_1 \cdot s+1)$ which remains in a numerator of equation (22) can be compensated, the estimation accuracy of open-circuit voltage $V_0$ can be improved. It is noted that equation (21) corresponds to equation (5). That is to say, equation (21) is derived from $(T_1 \cdot s+1) \cdot V_0 = (T_1 \cdot s+1)(T_3 \cdot S+1) \cdot V - K \cdot (T_2 \cdot s+1)$ $(T_3 \cdot s+1) \cdot (T_3 \cdot s+1) \cdot I$. If the following three equations are substituted into the above-described deformation of equathe open-circuit voltage $V_0$ is structured in transfer function that as in the general equation (1), that in the preferred embodiment, equation (7) (=equation (6)). Hence, it is made possible to apply an adaptive digital filter such as a least square method (well known estimation algorithm). Consequently, it becomes possible to estimate parameters in equations (viz., open-circuit voltage $V_0$ which is an offset term and poly-nominal equations A(s), B(s), and C(s)) in a form of a batch processing. These parameters are largely affected by the charge rate, a surrounding temperature, and a deterioration and varied instantaneously. It is possible to sequentially estimate the adaptive digital filter with good accuracy. Then, if a unique correlation between the open-circuit voltage $V_0$ and the charge rate as shown in FIG. 4 are stored, the estimated open-circuit voltage can be converted to the charge rate. Hence, it is possible to sequentially estimate the charge rate in the same way as the parameters described above.

(2) In a case where the equation (1) which is the relationship equation of current I and terminal voltage V of the secondary cell is approximated to equation (4), the equation such that no offset term is included (viz., the open-circuit voltage $V_0$), a product-and-addition equation between a measurable current I which is filter processed and a terminal voltage V which is filter processed and unknown parameter (coefficient parameters of poly-nominal equations A(s), B(s), and C(s) and h) is obtained. A normally available adaptive digital filter (the least mean square method and well known parameter estimation algorithm) can directly be applied in a continuous time series.

As a result of this, the unknown parameters can be estimated in the batch processing manner and the estimated parameter h is substituted into equation (2), the estimated value of open-circuit voltage $V_0$ can easily be calculated. All of these parameters are varied instantaneously, the adaptive digital filter can serve to estimate the charge rate at any time with a high accuracy. Since a constant relationship between open-circuit voltage $V_0$ and the charge rate (SOC) is established as shown in FIG. 4, if this relationship is previously stored, the charge rate (SOC) can be estimated from the estimated value of open-circuit voltage $V_0$.

FIGS. 6A through 6I integrally shows signal timing charts with current I and terminal voltage V inputted into adaptive digital filter and representing results of simulation graphs when each parameter is estimated. As far as a time constant of a first order delay in equation (6) is concerned, $T_1 < T_0$. Since all parameters a through f (refer to equation (11)) are favorably estimated, the estimated value of open-circuit voltage $V_0$ can be said to be well coincident with a real value.

It is noted that, in FIG. 6C which indicates the open-circuit voltage, a reason that a right side second term of equation (6) is described is to indicate that the open-circuit voltage estimated value is coincident with a real value almost without delay in spite of the fact that a late term of time constant $T_3$ is measured on the terminal voltage inputted into the adaptive filter. In details, since the parameter estimation with the cell model formatted adaptive digital filter in equation (6), all of parameters a through f can favorably be estimated and the estimated value of open-circuit voltage $V_0$ is well coincident with a real value.

(3) In addition, as described in item (2), in the structure in which the open-circuit voltage $V_0$ is calculated from equation (2), the integration occurs before a value at which estimated value h is converged to the real value, its error cannot be eliminated. However, in the structure in which equation (5) in which the integration is not included, the error before the parameter estimated value is converged into the real value does not give an influence after the convergence.

It will be appreciated that, in part of ① in FIG. 6I, before estimated value f is converged into a real value, an erroneous estimation is carried out only at momentarily. In equation (2), this value is also integrated so that the error is not eliminated. However, the error is not eliminated since even this value is integrated. However, in the structure using equation (5), open-circuit voltage $V_0$ is calculated from the equation in which the integration is not included. Hence, after the parameter estimated value is converged into the real time, this erroneous estimation portion is eliminated.

(4) Furthermore, in a case where equation (6) is used in place of equation (1), a calculation time and program capacity can be suppressed to a minimum while having the above-described advantages.

The entire contents of a Japanese Patent Application No. 2002-340803 (filed in Japan on Nov. 25, 2002) are herein incorporated by reference. The scope of the invention is defined with reference to the following claims.

What is claimed is:

1. A charge rate estimating apparatus for a secondary cell, comprising:
a current detecting section capable of measuring a current flowing through the secondary cell;
a terminal voltage detecting section capable of measuring a voltage across terminals of the secondary cell;
a parameter estimating section that calculates an adaptive digital filtering using a cell model in a continuous time series shown in an equation (1) and estimates all parameters at one time, the parameters corresponding to an open-circuit voltage $V_0$ which is an offset term of the equation (1) and coefficients of A(s), B(s), and C(s), which are transient terms; and
a charge rate estimating section that estimates the charge rate from a previously derived relationship between an open-circuit voltage and a charge rate of the secondary cell and the open-circuit voltage $V_0$, $$V = \frac{B(s)}{A(s)} \cdot I + \frac{1}{C(s)} \cdot V_0, \quad (1)$$

wherein s denotes a Laplace transform operator, A(s), B(s), and C(s) denote poly-nominal functions of s,
wherein the open-circuit voltage $V_0$ of the cell model in the continuous time series shown in the equation (1) is approximated by means of an equation (2) to provide an equation (3) and the adaptive digital filter calculation is carried out using the equation (3) and equivalent equation (4), h is estimated in at least equation (4), the estimated h is substituted into equation (2) to derive an open-circuit voltage $V_0$, and the charge rate is estimated from the previously derived relationship between an open-circuit voltage and a charge rate of the secondary cell and the open-circuit voltage $V_0$ $$V_0 = \frac{h}{s} \cdot I \quad (2)$$

$$V = \left( \frac{B(s)}{A(s)} + \frac{1}{C(s)} \cdot \frac{h}{s} \right) \cdot I = \frac{s \cdot B(s) \cdot C(s) + h \cdot A(s)}{s \cdot A(s) \cdot C(s)} \cdot I \quad (3)$$

$$\frac{s \cdot A(s) \cdot C(s)}{G_1(s)} \cdot V = \frac{s \cdot B(s) \cdot C(s) + h \cdot A(s)}{G_1(s)} \cdot I, \quad (4)$$

wherein s denotes the Laplace transform operator, A(s), B(s), and C(s) denote poly-nominal equation functions, h denotes a variable, and $1/G_1(s)$ denotes a transfer function having a low pass filter characteristic.

2. A charge rate estimating apparatus for a secondary cell, comprising:
a current detecting section capable of measuring a current flowing through the secondary cell;
a terminal voltage detecting section capable of measuring a voltage across terminals of the secondary cell;
a parameter estimating section that calculates an adaptive digital filtering using a cell model in a continuous time series shown in an equation (1) and estimates all parameters at one time, the parameters corresponding to an open-circuit voltage $V_0$, which is an offset term of the equation (1), and coefficients of A(s), B(s), and C(s), which are transient terms; and
a charge rate estimating section that estimates the charge rate from a previously derived relationship between an open-circuit voltage and a charge rate of the secondary cell and the open-circuit voltage $V_0$, $$V = \frac{B(s)}{A(s)} \cdot I + \frac{1}{C(s)} \cdot V_0, \quad (1)$$

wherein s denotes a Laplace transform operator, A(s), B(s), and C(s) denote poly-nominal functions of s, wherein the open-circuit voltage $V_0$ of the cell model in the time continuous time series is approximated in an equation (2) to calculate an equation (3), the adaptive digital filter calculation is carried out using an equation (4) which is equivalent to the equation (3), A(s), B(s), and C(s) are estimated from equation (4), the estimated A(s), B(s), and C(s) are substituted into equation (5) to determine $V_0/G_2(s)$ and the charge rate is estimated from the previously derived relationship between an open-circuit voltage and a charge rate of the secondary cell and the open-circuit voltage $V_0$ using the derived $V_0/G_2(s)$ in place of the open-circuit voltage $V_0$, $$V_0 = \frac{h}{s} \cdot I \quad (2)$$

$$V = \left(\frac{B(s)}{A(s)} + \frac{1}{C(s)} \cdot \frac{h}{s}\right) \cdot I = \frac{s \cdot B(s) \cdot C(s) + h \cdot A(s)}{s \cdot A(s) \cdot C(s)} \cdot I \quad (3)$$

$$\frac{s \cdot A(s) \cdot C(s)}{G_1(s)} \cdot V = \frac{s \cdot B(s) \cdot C(s) + h \cdot A(s)}{G_1(s)} \cdot I, \quad (4)$$

$$\frac{V_0}{G_2(s)} = \frac{C(s)}{G_2(s)} \cdot \left(V - \frac{B(s)}{A(s)} \cdot I\right), \quad (5)$$

wherein s denotes the Laplace transform operator, A(s), B(s), and C(s) denote the polynominal (equation) function of s, h denotes a variable, $1/G_1(s)$ and $1/G_2(s)$ denote transfer functions having the low pass filter characteristics.

3. A charge rate estimating apparatus for a secondary cell as claimed in claim 1, wherein the cell model is calculated from an equation (6), $$V = \frac{K \cdot (T_2 \cdot s + 1)}{T_1 \cdot s + 1} \cdot I + \frac{1}{T_3 \cdot s + 1} V_0,$$

wherein K denotes an internal resistance of the secondary cell, $T_1$, $T_2$, and $T_3$ denote time constants and, $1/G_1(s)$ denotes a low pass filter having a third order or more, wherein $A(s)=T_1 \cdot s+1$, $B(s)=K \cdot (T_2 S+1)$, $C(s)=T_3 \cdot S+1$.

4. A charge rate estimating apparatus for a secondary cell as claimed in claim 3, wherein $$V = \frac{K \cdot (T_2 \cdot s + 1)}{T_1 \cdot s + 1} \cdot I + \frac{1}{T_3 \cdot s + 1} \cdot \frac{A}{s} \cdot I \quad (9)$$

$(a \cdot s^3 + b \cdot s^2 + s) \cdot V = (c \cdot s^3 + d \cdot s^2 + e \cdot s + f) \cdot I$ - - - (10).

5. A charge rate estimating apparatus for a secondary cell as claimed in claim 4, wherein $a=T_1 \cdot T_3$, $b=T_1+T_3$, $c=K \cdot T_2 \cdot T_3$, $d=K \cdot (T_2+T_3)$, $e=K+A \cdot T_1$, $f=A$ - - - (11).

6. A charge rate estimating apparatus for a secondary cell as claimed in claim 5, wherein a stable low pass filter $G_1(s)$ is introduced into both sides of the equation (10) to derive the following equation:

$$\frac{1}{G_1(s)}(a \cdot s^3 + b \cdot s^2 + s) \cdot V = \frac{1}{G_1(s)}(c \cdot s^3 + d \cdot s^2 + e \cdot s + f) \cdot I. \quad (12)$$

7. A charge rate estimating apparatus for a secondary cell as claimed in claim 6, wherein actually measurable currents I and terminal voltages V which are processed by means of a low pass filter are as follows:

$$I_0 = \frac{1}{G_1(s)} \cdot I, \quad (13)$$

$$I_1 = \frac{s}{G_1(s)} \cdot I, \quad V_1 = \frac{s}{G_1(s)} \cdot V,$$

$$I_2 = \frac{s^2}{G_1(s)} \cdot I, \quad V_2 = \frac{s^2}{G_1(s)} \cdot V,$$

$$I_3 = \frac{s^3}{G_1(s)} \cdot I, \quad V_3 = \frac{s^3}{G_1(s)} \cdot V, \text{ and}$$

$$\frac{1}{G_1(s)} = \frac{1}{(p1 \cdot s + 1)^3}.$$

8. A charge rate estimating apparatus for a secondary cell as claimed in claim 7, wherein, using the equation (13), the equation of (12) is rewritten and rearranged as follows:

$$V_1 = [\, V_3 \;\; V_2 \;\; I_3 \;\; I_2 \;\; I_1 \;\; I_0 \,] = \begin{bmatrix} -a \\ -b \\ c \\ d \\ e \\ f \end{bmatrix} \quad (15)$$

and the equation (15) corresponds to a general equation which is coincident with a standard form of a general adaptive digital filter of equation (16): $y = \omega^T \cdot \theta$ - - - (16), wherein $y=V_1$, $\omega^T=[V_3\; V_2\; I_3\; I_2\; I_1\; I_0]$, and $$\theta = \begin{bmatrix} -a \\ -b \\ c \\ d \\ e \\ f \end{bmatrix}. \quad (17)$$

9. A charge rate estimating apparatus for a Secondary cell as claimed in claim 8, wherein a parameter estimating algorithm with the equation (16) as a prerequisite is defined as follows:

$$\gamma(k) = \frac{\lambda_3(k)}{1 + \lambda_3(k) \cdot \omega^T(k) \cdot P(k-1) \cdot \omega(k)} \quad (18)$$

$$\theta(k) = \theta(k-1) - \gamma(k) \cdot P(k-1) \cdot \omega(k) \cdot [\omega^T(k) \cdot \theta(k-1) - y(k)]$$

-continued $$P(k) = \frac{1}{\lambda_1(k)}\left\{P(k-1) - \frac{\lambda_3(k) \cdot P(k-1) \cdot \omega(k) \cdot \omega^T(k) \cdot P(k-1)}{1 + \lambda_3(k) \cdot \omega^T(k) \cdot P(k-1) \cdot \omega(k)}\right\}$$

$$= \frac{P'(k)}{\lambda_1(k)}$$

$$\lambda_1(k) = \left\{\frac{\text{trace}\{P'(k)\}}{\gamma_U} : \lambda_1 \leq \frac{\text{trace}\{P'(k)\}}{\gamma_U}\right.$$

$$\left\{\lambda_1 : \frac{\text{trace}\{P'(k)\}}{\gamma_U} \leq \lambda_1 \leq \frac{\text{trace}\{P'(k)\}}{\gamma_L}\right\}$$

$$\left\{\frac{\text{trace}\{P'(k)\}}{\gamma_L} : \frac{\text{trace}\{P'(k)\}}{\gamma_L} \leq \lambda_1\right\},$$

wherein θ(k) denotes a parameter estimated value at a time point of k (k=0, 1, 2, 3 - - - ), $\lambda_1$, $\lambda_3(k)$, γu, and γL denote initial set value, b<$\lambda_1$<1, 0<$\lambda_3(k)$<∞, P(0) is a value, of P(k) at k=0, θ(0) is θ(k) at k=0 and θ(0) provides an initial value which is non-zero, and trace{P} means a trace of matrix P.

10. A charge rate estimating method for a secondary cell, comprising:
measuring a current flowing through the secondary cell;
measuring a voltage across terminals of the secondary cell;
calculating an adaptive digital filtering to provide an adaptive digital filter calculation using a cell model in a continuous time series shown in an equation (1);
estimating all parameters at one time, the parameters corresponding to an open-circuit voltage $V_0$, which is an offset term of the equation (1), and coefficients of A(s), B(s), and C(s), which are transient terms; and
estimating the charge rate from a previously derived relationship between an open-circuit voltage and a charge rate of the secondary cell and the open-circuit voltage $V_0$, $$V = \frac{B(s)}{A(s)} \cdot I + \frac{1}{C(s)} \cdot V_0, \quad (1)$$

wherein s denotes a Laplace A(s) C(s) transform operator, A(s), B(s), and C(s) denote poly-nominal functions of s,
wherein the open-circuit voltage $V_0$ of the cell model in the continuous time series shown in the equation (1) is approximated by means of an equation (2) to provide an equation (3) and the adaptive digital filter calculation is carried out using the equation (3) and equivalent equation (4), h is estimated in at least equation (4), the estimated value of h is substituted into equation (2) to derive an open-circuit voltage $V_0$, and the charge rate is estimated from the previously derived relationship between an open-circuit voltage and a charge rate of the secondary cell and the open-circuit voltage $V_0$ and the charge rate $$V_0 = \frac{h}{s} \cdot I \quad (2)$$

$$V = \left(\frac{B(s)}{A(s)} + \frac{1}{C(s)} \cdot \frac{h}{s}\right) \cdot I = \frac{s \cdot B(s) \cdot C(s) + h \cdot A(s)}{s \cdot A(s) \cdot C(s)} \cdot I \quad (3)$$

$$\frac{s \cdot A(s) \cdot C(s)}{G_1(s)} \cdot V = \frac{s \cdot B(s) \cdot C(s) + h \cdot A(s)}{G_1(s)} \cdot I, \quad (4)$$

wherein s denotes the Laplace transform operator, A(s), B(s), and C(s) denote poly-nominal equation functions, h denotes a variable, and $1/G_1(s)$ denotes a transfer function having a low pass filter characteristic.

11. A charge rate estimating method for a secondary cell, comprising:
measuring a current flowing through the secondary cell;
measuring a voltage across terminals of the secondary cell;
calculating an adaptive digital filtering to provide an adaptive digital filter calculation using a cell model in a continuous time series shown in an equation (1);
estimating all parameters at one time, the parameters corresponding to an open-circuit voltage $V_0$, which is an offset term of the equation (1), and coefficients of A(s), B(s), and C(s), which are transient terms; and
estimating the charge rate from a previously derived relationship between an open-circuit voltage and a charge rate of the secondary cell and the open-circuit voltage $V_0$, $$V = \frac{B(s)}{A(s)} \cdot I + \frac{1}{C(s)} \cdot V_0, \quad (1)$$

wherein s denotes a Laplace transform operator, A(s), B(s), and C(s) denote poly-nominal functions of s,
wherein the open-circuit voltage $V_0$ of the cell model in the continuous time series is approximated in an equation (2) to calculate an equation (3), the adaptive digital filter calculation is carried out using an equation (4) which is equivalent to the equation (3), A(s), B(s), and C(s) are estimated from the equation (4), the estimated A(s), B(s), and C(s) are substituted into equation (5) to determine $V_0/G_2(s)$ and the charge rate is estimated from the previously derived relationship between an open-circuit voltage and a charge rate of the secondary cell, and the open-circuit voltage $V_0$ and the charge rate using the derived $V_0/G_2(s)$ in place of the open-circuit voltage $V_0$, $$V_0 = \frac{h}{s} \cdot I \quad (2)$$

$$V = \left(\frac{B(s)}{A(s)} + \frac{1}{C(s)} \cdot \frac{h}{s}\right) \cdot I = \frac{s \cdot B(s) \cdot C(s) + h \cdot A(s)}{s \cdot A(s) \cdot C(s)} \cdot I \quad (3)$$

$$\frac{s \cdot A(s) \cdot C(s)}{G_1(s)} \cdot V = \frac{s \cdot B(s) \cdot C(s) + h \cdot A(s)}{G_1(s)} \cdot I, \quad (4)$$

$$\frac{V_0}{G_2(s)} = \frac{C(s)}{G_2(s)} \cdot \left(V - \frac{B(s)}{A(s)} \cdot I\right), \quad (5)$$

wherein s denotes the Laplace $G_2(s)$ $G_2(s)$ A(s) transform operator, A(s), B(s), and C(s) denote the polynominal (equation) function of s, h denotes a variable, $1/G_1(s)$ and $1/G_2(s)$ denote transfer functions having the low pass filter characteristics.

12. A charge rate estimating method for a secondary cell as claimed in claim 10, wherein the cell model is calculated from an equation (6), $$V = \frac{K \cdot (T_2 \cdot s + 1)}{T_1 \cdot s + 1} \cdot I + \frac{1}{T_3 \cdot s + 1} V_0,$$

wherein K denotes an internal resistance of the secondary cell, $T_1$, $T_2$, and $T_3$ denote time constants, $1/G_1(s)$ denotes a low pass filter having a third order or more.

13. A charge rate estimating apparatus for a secondary cell as claimed in claim 2, wherein the cell model is calculated from an equation (6), $$v = \frac{K \cdot (T_2 \cdot s + 1)}{T_1 \cdot s + 1} \cdot I + \frac{1}{T_3 \cdot s + 1} v_0$$

wherein K denotes an internal resistance of the secondary cell, $T_1$, $T_2$, and $T_3$ denote time constants, $1/G_1(s)$ denotes a low pass filter having a third order or more, and $1/G_2(s)$ denotes another low pass filter having a second order or more, wherein $A(s)=T_1 \cdot s+1$, $B(s)=K \cdot (T_2 S+1)$, $C(s)=T_3 \cdot S+1$.

14. A charge rate estimating apparatus for a secondary cell, comprising:

a current detecting section capable of measuring a current flowing through the secondary cell;

a terminal voltage detecting section capable of measuring a voltage across terminals of the secondary cell;

a parameter estimating section that calculates an adaptive digital filtering using a cell model in a continuous time series shown in an equation (1) estimates all of parameters at one time, the parameters corresponding to an open-circuit voltage $V_0$ which is an offset term of the equation (1) and coefficients of A(s), B(s), and C(s) which are transient terms; and a charge rate estimating section that estimates the charge rate from a previously derived relationship between an open-circuit voltage and a charge rate of the secondary cell, and the open-circuit voltage $V_0$, $$V = \frac{B(s)}{A(s)} \cdot I + \frac{1}{C(s)} \cdot V_0, \quad (1)$$

wherein s denotes a Laplace transform operator, A(s), B(s), and C(s) denote poly-nominal functions of s, Wherein the open-circuit voltage $V_0$ of the cell model in the continuous time series shown in the equation (1) is approximated by means of an equation (2) to provide an equation (3) and the adaptive digital filter calculation is carried out using the equation (3) and equivalent equation (4), h is estimated in at least equation (4), the estimated h is substituted into equation (2) to derive an open-circuit voltage $V_0$, and the charge rate is estimated from the previously derived relationship between an open-circuit voltage and a charge rate of the secondary cell and the open-circuit voltage $V_0$, $$v_0 = \frac{h}{s} \cdot I \quad (2)$$

Where equations (3) and (4) do not include the open-circuit voltage $V_0$, but are product and addition equations relating V and I.

15. A charge rate estimating method for a secondary cell as claimed in claim 11, wherein the cell model is calculated from an equation (6), $$v = \frac{K \cdot (T_2 \cdot s + 1)}{T_1 \cdot s + 1} \cdot I + \frac{1}{T_3 \cdot s + 1} v_0$$

wherein K denotes an internal resistance of the secondary cell, $T_1$, $T_2$, and $T_3$ denote time constants, $1/G_1(s)$ denotes a low pass filter having a third order or more, and $1/G_2(s)$ denotes another low pass filter having a second order or more.

\* \* \* \* \*